United States Patent [19]

Rogers

[11] Patent Number: 5,191,239
[45] Date of Patent: Mar. 2, 1993

[54] RESET GATE FOR A PHASE DETECTOR IN A PHASE-LOCKED LOOP

[75] Inventor: Alan C. Rogers, Palo Alto, Calif.

[73] Assignee: Sun Microsystems, Inc., Mountain View, Calif.

[21] Appl. No.: 810,683

[22] Filed: Dec. 19, 1991

[51] Int. Cl.⁵ .......................... H03K 19/20; H03K 5/00
[52] U.S. Cl. ...................................... 307/445; 307/446; 307/262; 307/514; 328/155; 328/133
[58] Field of Search ............... 307/445, 446, 451, 262, 307/511, 514; 328/133, 155

[56] References Cited

U.S. PATENT DOCUMENTS 4,645,952  2/1987  Van Tran .......................... 307/451

Primary Examiner—Timothy P. Callahan
Attorney, Agent, or Firm—Blakely Sokoloff Taylor & Zafman

[57] ABSTRACT

A high reliability phase-locked loop (PLL) is disclosed having a hyperactivity detection and correction circuit (HDC) to oversee the oscillator and the phase and frequency detector (PFD), and having a PFD reset gate that performs the required logic function to reset the PFD while not being vulnerable to an internal PFD race condition that plagues prior art phase-locked loop circuits. The HDC senses the oscillator control and signals an oscillator reset should the oscillator control rise to an abnormally high level above a predetermined limit while the PFD is not detecting the feedback signal. The oscillator reset signal then slowly propagates through an asymmetrical delay line and resets the oscillator control to a predetermined reset state. While the oscillator control is being reset, the HDC continues to monitor the oscillator control, and de-asserts the oscillator reset when the oscillator control drops to the predetermined reset state. The PLL circuit can then function normally to lock on to the reference signal. The HDC incorporates means to prevent an oscillator reset should the PLL lock onto a reference signal having a corresponding oscillator control greater than the predetermined limit, and means to prevent termination of the oscillator reset once the HDC has begun resetting the oscillator control. The PFD reset gate performs the required four input NOR logic function and provides a fast switching reset signal. The PFD reset gate does not de-assert PFD reset until all portions of the PFD have responded to the PFD reset.

16 Claims, 6 Drawing Sheets ically high. System power-up or reset can cause the VCO control to go higher than normal. This condition may also occur when the system returns from test mode. A higher than normal VCO control results in higher than normal VCO frequency, which can cause reduced loop gain because components in the loop may not be able to distribute a high frequency signal. The distribution network can severely attenuate the signal to the point where the feedback signal is not detected the PFD. As a consequence, the VCO may run faster as the normal response to a high control, or the VCO may stall. In either case, the PFD detects the large difference in frequency between the reference and feedback signals and increases the VCO control, which causes an increase in the VCO frequency and thereby worsens the problem.

RESET GATE FOR A PHASE DETECTOR IN A PHASE-LOCKED LOOP

BACKGROUND OF THE INVENTION

1. Field of the Invention

The present invention relates to the field of electronic circuits, and more particularly, to phase-locked loop circuits, which may be used in a variety of computer system applications and electronic circuit applications.

2. Art Background

A typical prior art phase-locked loop (PLL) circuit is comprised of a phase and frequency detector, a low-pass filter, and a voltage controlled oscillator. The phase and frequency detector (PFD) compares two input signals, a reference signal and a feedback signal, and generates a phase error signal that is a measure of their phase difference. The phase error signal from the PFD is filtered by the low-pass filter and fed into the control input of the voltage controlled oscillator (VCO). The VCO generates a periodic signal with a frequency controlled by the filtered phase error signal. The VCO output is coupled to the feedback input of the PFD, thereby forming a feedback loop. The feedback loop may contain other components such as clock buffers or clock distribution networks. If the frequency of the feedback signal is not equal to the frequency of the reference signal, the filtered phase error signal causes the VCO frequency to deviate toward the frequency of the reference, until the VCO finally "locks" onto the frequency of the reference signal.

Applications for PLL circuits are many and varied. They include clock circuits for high speed computer systems, tone decoding, demodulation of AM and FM signals, frequency multiplication, frequency synthesis, and pulse synchronization of signals from noisy sources.

However, prior art PLL circuits are unreliable under conditions that cause the VCO control to be abnormally high. System power-up or reset can cause the VCO control to go higher than normal. This condition may also occur when the system returns from test mode. A higher than normal VCO control results in higher than normal VCO frequency, which can cause reduced loop gain because components in the loop may not be able to distribute a high frequency signal. The distribution network can severely attenuate the signal to the point where the feedback signal is not detected the PFD. As a consequence, the VCO may run faster as the normal response to a high control, or the VCO may stall. In either case, the PFD detects the large difference in frequency between the reference and feedback signals and increases the VCO control, which causes an increase in the VCO frequency and thereby worsens the problem.

Moreover, the standard digital PFD used in some prior art PLL circuits is vulnerable to an internal race condition during PFD reset. The standard edge triggered lead-lag digital PFD is composed of logic gates that are interconnected to form a set of four latches, two latches in the lead portion of the PFD and two latches in the lag portion. A PFD reset gate resets all four latches after the PFD has sampled the reference and feedback signals. The standard prior art PFD reset gate is a four input NOR logic gate. Two inputs to the PFD reset gate indicate that the latches in the lead portion of the PFD have reset, while the remaining two inputs indicate that the latches in the lag portion have reset. The PFD reset signal is asserted when all four inputs to the PFD reset gate are low. However, if any one of the four inputs goes high the PFD reset de-asserts. It can be appreciated that if one portion of the PFD is faster than the other, the PFD reset will de-assert before both portions have reset. This can cause the PFD to miss the next cycle of the reference or feedback signals and fail to detect their phase difference.

A common method of guarding against this race condition is to add extra gates to the output of the PFD reset gate in order to widen the pulse width of the reset signal, in the hope that both portions of the PFD will reset during the extra reset time. However, a wider reset pulse does not guarantee that both portions of the PFD will reset during the expanded reset time; it just makes it more likely. Also, increasing the reset pulse reduces the capture range of the PFD since the reference and feedback signals cannot be sampled during reset.

As will be described, the present invention overcomes problems associated with prior art PLL circuits by providing a hyperactivity detection and correction circuit that corrects an abnormally high VCO control, and a PFD reset gate that is not vulnerable to the internal race condition described above.

SUMMARY OF THE INVENTION

A high reliability phase-locked loop is disclosed having a hyperactivity detection and correction circuit (HDC) to oversee the functioning of the oscillator and PFD. The HDC monitors the oscillator control and monitors PFD detection of the feedback signal. If the oscillator control is abnormally high and no feedback signal is detected, the HDC resets the oscillator control to a low level. The HDC then releases the oscillator control to allow the PLL to function normally and lock on to the reference signal. The high reliability phase-locked loop of the present invention also discloses a PFD reset gate for a digital PFD that performs the required logic function to reset the PFD, while not being vulnerable to an internal PFD race condition that plagues prior art PLL circuits.

The HDC is comprised of three functional portions; a detection circuit, an asymmetrical delay line, and a reset circuit. The detection circuit senses the oscillator control. The detection circuit triggers a low to high voltage transition at its output when the oscillator control rises above a predetermined limit, and triggers a high to low transition at its output when the oscillator control falls to a predetermined reset state. The output of the detection circuit is coupled to the three stage asymmetrical delay line. The asymmetrical delay line delays propagation of a low to high voltage transition and propagates with little delay a high to low transition. The output node of the asymmetrical delay line is coupled to the reset circuit. The reset circuit is coupled to an oscillator control circuit.

The HDC detects oscillator hyperactivity by monitoring the oscillator control. During normal PLL operation, the oscillator control should be below the predetermined limit of the detection circuit. However, should the oscillator control rise above the predetermined limit, the detection circuit triggers a low to high voltage transition at its output node, thereby signalling an oscillator reset. The oscillator reset signal then slowly propagates through the asymmetrical delay line, eventually reaching the reset circuit of the HDC. The oscillator reset signal causes the reset circuit to reset the oscillator control to the predetermined reset state. While the oscillator control is being reset, the detection circuit continues to monitor the oscillator control. When the oscillator control reaches the predetermined reset state, the detection circuit triggers a high to low transition at its output. The high to low transition propagates through the asymmetrical delay line with little delay and quickly causes the reset circuit to release the oscillator control control. The PLL circuit can then function normally to lock on to the reference signal.

The HDC incorporates means to prevent resetting of the oscillator control should the PLL lock onto a reference signal having a corresponding oscillator control greater than the predetermined limit of the detection circuit. To accomplish this, the HDC receives a feedback sense signal from the PFD that indicates whether the PFD is receiving a feedback signal. The feedback sense signal causes the HDC to de-assert the oscillator reset. The HDC also has means to prevent the feedback sense signal from terminating the oscillator reset once the reset circuit has begun resetting the oscillator control.

In addition, the PFD reset gate of the present invention performs the required four input NOR logic function to reset a digital PFD, and provides a fast switching reset signal in order to minimize the pulse widths of the lead and lag inputs to the PFD push-pull charge pump. The PFD reset gate of the present invention will not de-assert PFD reset signal until the both lead and the lag portions of the PFD have responded to the reset, thereby avoiding the consequences of a race condition caused when either the lead or lag portions of the PFD resets more quickly.

DETAILED DESCRIPTION OF THE INVENTION

A high reliability phase-locked loop is disclosed having a hyperactivity detection and correction circuit (HDC) to oversee the functioning of the oscillator and PFD, and a PFD reset gate that performs the required logic function to reset a digital PFD, while not being vulnerable to an internal PFD race condition that plagues prior art PFD circuits. In the following description, for purposes of explanation, specific transistors, circuit devices, device dimensions, circuit architectures, and components are set forth in order to provide a more thorough understanding of the present invention. However, it will be apparent to one skilled in the art that the present invention may be practiced without these specific details. In other instances, well known circuits and devices are shown in schematic form in order not to obscure the present invention unnecessarily.

Figure 1:
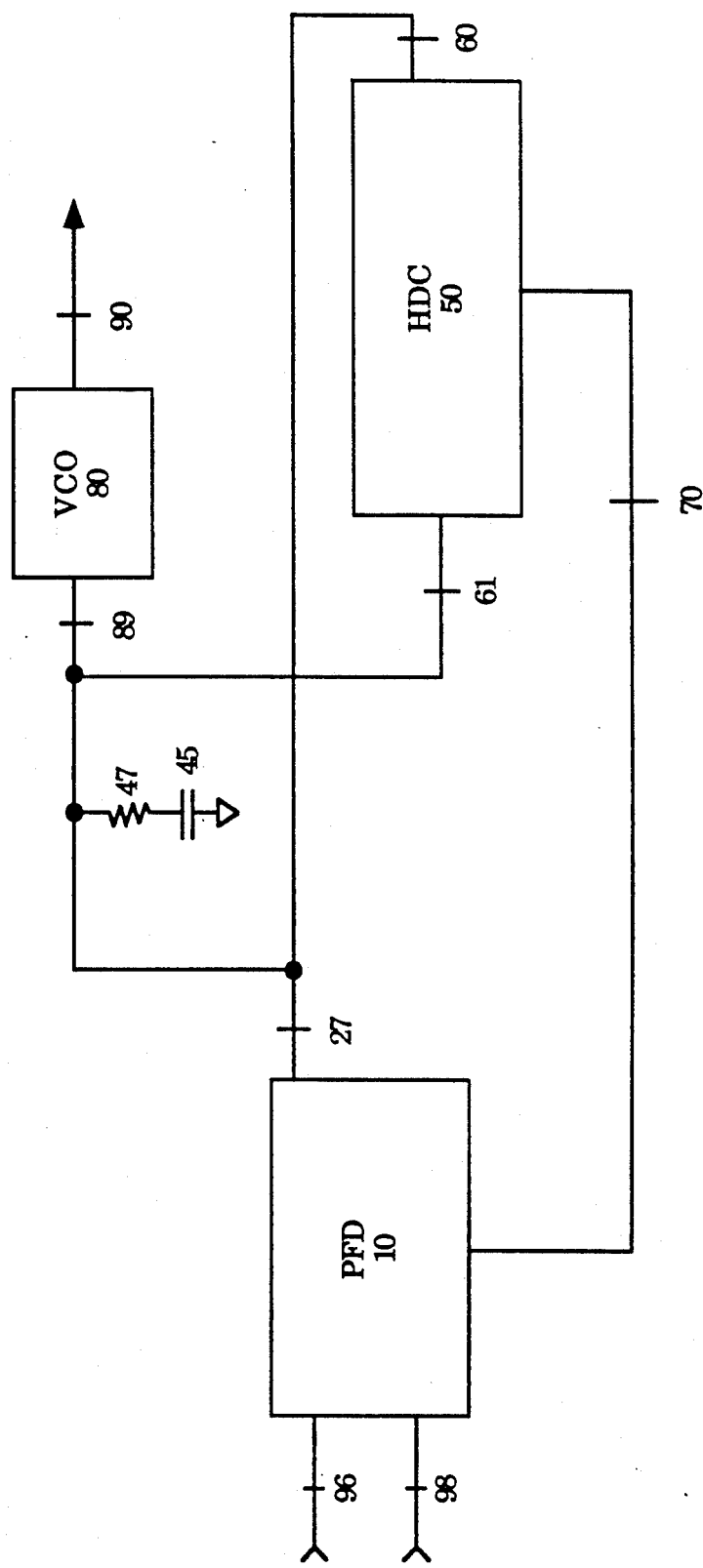
FIG. 1 provides a block diagram of an embodiment of the high reliability phase-locked loop of the present invention when used with a voltage controlled oscillator.

A block diagram of an embodiment of present invention that uses a voltage controlled oscillator (VCO) is provided by FIG. 1 which shows PFD 10, VCO 80, and HDC 50. PFD 10 compares reference signal 96 and feedback signal 98, and generates a phase error signal 27 that is a measure of their phase difference. Phase error signal 27 is coupled to the series circuit of capacitor 45 and resistor 47. Resistor 47 provides damping for the control loop. The phase error signal is filtered by capacitor 45 and fed into VCO control 89, which is the control input to VCO 80. VCO 80 generates a periodic signal output having a frequency controlled by VCO control 89. VCO output 90 is coupled to feedback signal 98 of the PFD through other components such as clock buffers or clock distribution networks which are not shown. If the frequency of feedback signal 98 is not equal to the frequency of reference signal 96, the filtered phase error signal causes VCO 80 to deviate in frequency toward the frequency of reference 96, until VCO 80 finally "locks" onto reference 96. HDC 50 uses sense line 61 to monitor the VCO control. HDC 50 uses signal line 60 to discharge capacitor 45. Sense line 70 provides a feedback sense signal from the PFD to the HDC to indicate whether the PFD is receiving a feedback signal 98. In this embodiment, sense line 70 is coupled to the reset gate of PFD 10. Alternatively, an edge detector for feedback signal 98 could be used to provide feedback sense and drive sense line 70. Also in this embodiment, signal lines 27, 60, 61 and 89 function as one node.

Figure 2A:
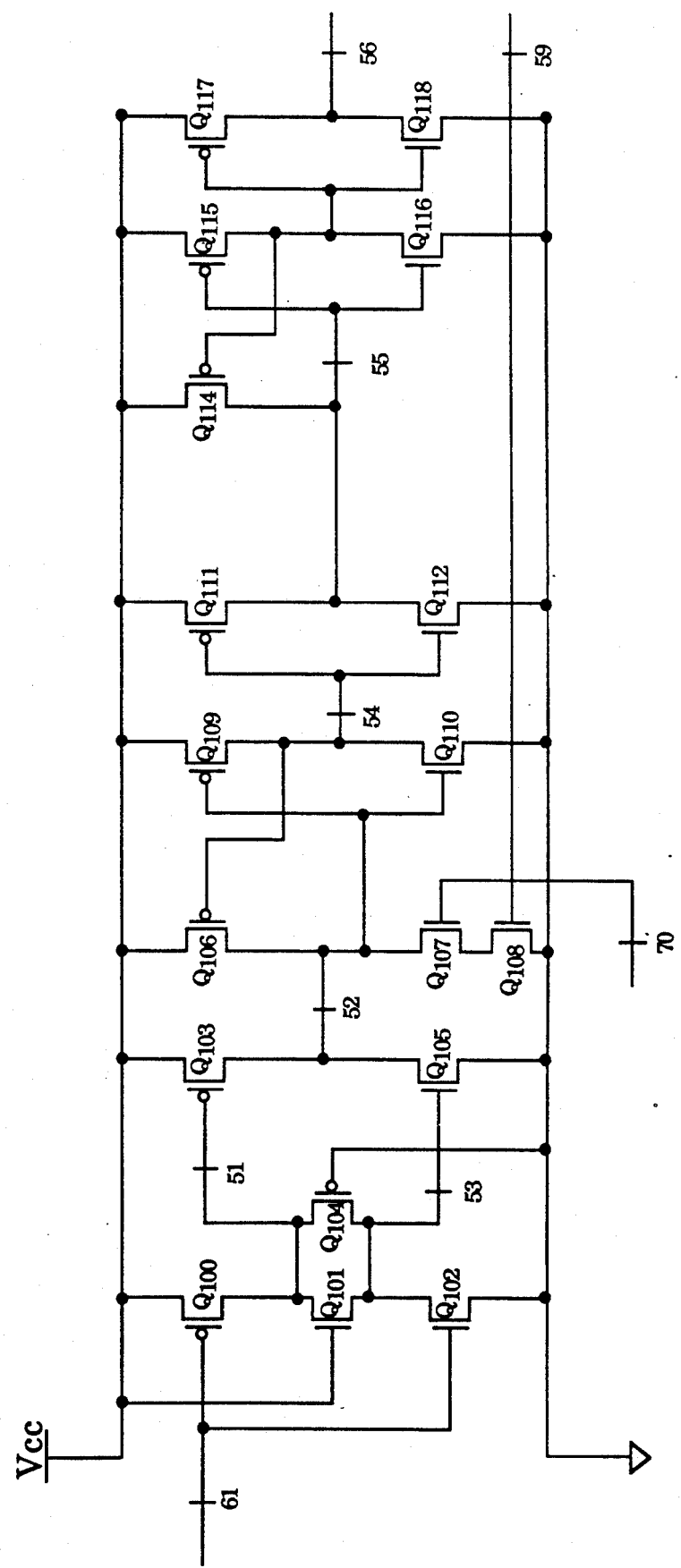
FIG. 2a illustrates a portion of the HDC, which includes the dual-threshold detector, the trigger latch, the trigger reset, and the first two stages of the asymmetrical delay line.
Figure 2B:
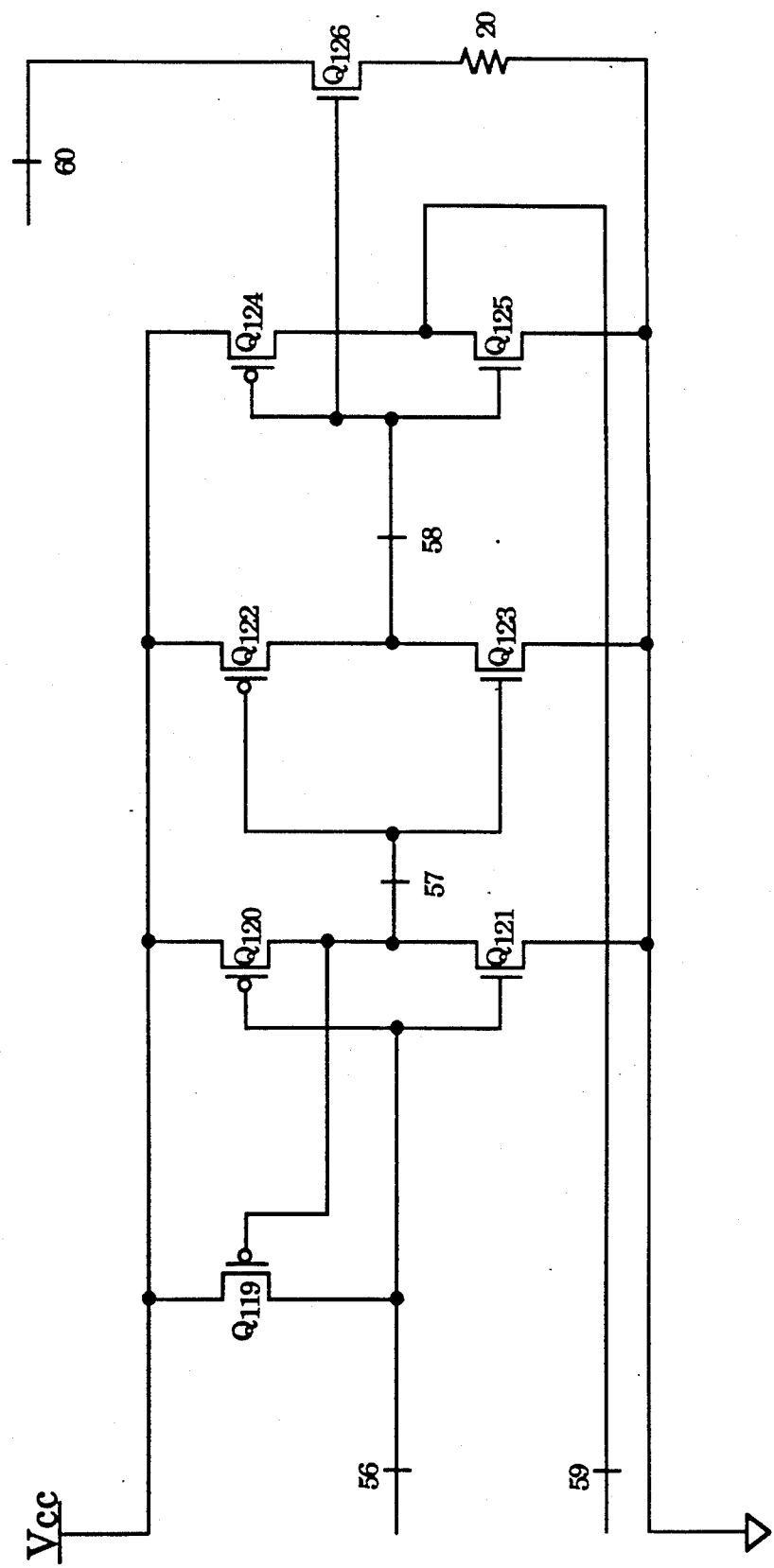
FIG. 2b illustrates the remaining portion of the HDC, including the final stage of the asymmetrical delay line and the open drain output.

The HDC is illustrated in FIGS. 2a and 2b. The HDC is comprised of three functional portions; a dual threshold detector, an asymmetrical delay line, and an open drain output. The dual threshold detector is composed of P-channel transistors $Q_{100}$, $Q_{103}$, and $Q_{104}$, along with N-channel transistors $Q_{101}$, $Q_{102}$, and $Q_{105}$. Sense line 61, which monitors the VCO control, is coupled to the gates of transistors $Q_{100}$ and $Q_{102}$. The dual threshold detector has two trigger voltages $V_{t1}$ and $V_{t2}$, given approximately by:

$$V_{t1} = V_{CC} - V_{tp},$$

and $$V_{t2} = V_{tn},$$

where $V_{CC}$ = supply voltage, $V_{tp}$ = gate to source threshold voltage for a P-channel transistor, and $V_{tn}$ = gate to source threshold voltage for an N-channel transistor.

The dual threshold detector triggers when the voltage on sense line 61 rises above $V_{t1}$ and when the voltage on sense line 61 falls below $V_{t2}$. In this embodiment, current flow through the front end of the dual threshold detector is limited by transistors $Q_{101}$ and $Q_{104}$. To accomplish this, it is preferable that transistor $Q_{101}$ have a gate width of 4 microns and a gate length of 4 microns and that transistor $Q_{104}$ have a gate width of 4 microns and a gate length of 2 microns. It is also preferable that transistor $Q_{100}$ have a gate width of 60 microns and a gate length of 1 micron and that transistor $Q_{102}$ have a gate width of 30 microns and a gate length of 1 micron. With these dimensions, transistors $Q_{100}$ and $Q_{102}$, each having a gate width to length ratio of 30, have a much higher capacity to pass current than transistors $Q_{101}$ and $Q_{104}$, which have gate width to length ratios of 1 and 2 respectively. It is important to remember that the transistor gate dimensions offered here and elsewhere in this specification are examples only, and that the present invention may be practiced without these specific numbers. The technology used in this embodiment can achieve gate lengths of less than 1 micron. However, the gate lengths above 1 micron help to prevent transistor leakage caused by extreme manufacturing and operating conditions.

As the voltage on sense line 61 rises above $V_{t1}$, transistor $Q_{100}$ largely switches off while transistor $Q_{102}$ remains switched on, and the current flow allowed by transistors $Q_{101}$ and $Q_{104}$ exceeds the current flow that can pass through transistor $Q_{100}$. As a result, the voltage at node 51 drops causing transistor $Q_{103}$ to switch on and pull node 52 high. On the other hand, as the voltage on sense line 61 falls below $V_{t2}$, transistor $Q_{102}$ begins to conduct poorly and the current flow allowed by transistors $Q_{101}$ and $Q_{104}$ exceeds the current flow that can pass through transistor $Q_{102}$. As a result, the voltage at node 53 rises causing transistor $Q_{105}$ to switch on and pull node 52 low. Thus, the dual threshold detector produces a low to high voltage transition at node 52 when the voltage on sense line 61 rises above $V_{t1}$ and a high to low transition at node 52 when the voltage on sense line 61 falls below $V_{t2}$.

As shown in FIGS. 2a and 2b, node 52 is coupled to a three stage asymmetrical delay line. The asymmetrical delay line delays propagation of a low to high voltage transition, and propagates with little delay a high to low transition. The first stage is comprised of transistors $Q_{106}$, $Q_{109}$, $Q_{110}$, $Q_{111}$, and $Q_{112}$, the second stage is comprised of transistors $Q_{114}$ through $Q_{118}$, and the third stage is comprised of transistors $Q_{119}$ through $Q_{123}$. Each of the three stages of the asymmetrical delay line function in an identical manner, which will be explained with reference to the first stage.

In the first stage of the asymmetrical delay line, the gates of P-channel transistor $Q_{109}$ and N-channel transistor $Q_{110}$ are coupled to node 52. It is preferable that transistor $Q_{109}$ have a higher gate width to gate length ratio than transistor $Q_{110}$, in order for transistor $Q_{109}$ to be more powerful than transistor $Q_{110}$ and have a higher capacity to conduct current than transistor $Q_{110}$. For example, transistor $Q_{109}$ has a gate 60 microns wide and 5 microns long, yielding a gate width to length ratio of 12, and transistor $Q_{110}$ has a gate 4 microns wide and 10 microns long, giving a gate width to length ration of 0.4. Since transistor $Q_{110}$ is relatively weak, the voltage at node 52 must attain a very high level before transistor $Q_{110}$ begins to switch on. Moreover, transistor $Q_{110}$ will switch on slowly because of its low capacity to conduct current relative to transistor $Q_{109}$. The relatively large gate length of transistor $Q_{110}$ provides a capacitive load that adds more delay to the switching time of the previous stage of the asymmetrical delay line. Therefore, a low to high transition at node 52 results in a slow high to low transition at node 54 as transistor $Q_{110}$ struggles to pull node 54 low. P-channel transistor $Q_{106}$ is provided to ensure that node 52 is eventually pulled high, thereby avoiding oscillation.

In turn, node 54 is coupled to the gates of P-channel transistor $Q_{111}$ and N-channel transistor $Q_{112}$. In this embodiment, it is preferable that transistor $Q_{111}$ be less powerful than transistor $Q_{112}$ and have a lower capacity to conduct current than transistor $Q_{112}$. Thus, for example, transistor $Q_{111}$ has a gate width of 4 microns and a gate length of 5 microns and transistor $Q_{112}$ has a gate width of 60 microns and a gate length of 5 microns. Since transistor $Q_{111}$ is relatively weak, a falling voltage at node 54 must attain a very low level before transistor $Q_{111}$ begins to switch on. Transistor $Q_{111}$ will switch on slowly because of its low capacity to conduct current relative to transistor $Q_{112}$. Also, the capacitive load caused by the relatively large gate length of transistor $Q_{111}$ adds more delay to the switching time of transistor $Q_{110}$. Therefore, a high to low transition at node 54 results in a slow low to high transition at node 55 as transistor $Q_{111}$ weakly pulls node 55 high.

As described above, a low to high transition at node 52 causes a slow high to low transition at node 54, which in turn causes a slow low to high transition at node 55. In this manner, a low to high transition at node 52 is slowly propagated through the first stage to node 55. However, a high to low transition at node 52 produces quite different results. When the voltage at node 52 begins a high to low transition, transistor $Q_{109}$ switches on quickly and quickly pulls up the voltage at node 54 because $Q_{109}$ is a much more powerful transistor than $Q_{110}$. The fast rising voltage at node 54 switches on transistor $Q_{112}$ which quickly pulls down the voltage at node 55 because transistor $Q_{112}$ is much more powerful than transistor $Q_{111}$. Thus, the first stage propagates with little delay a high to low transition at node 52 through to node 55.

There are three stages in the asymmetrical delay line, all of which function in the manner set forth above. However, the output section of the final stage provides for transition to the open drain output of the HDC. Referring to FIG. 2b, the gates of P-channel transistor $Q_{122}$ and N-channel transistor $Q_{123}$ are coupled to node 57. In this embodiment, both transistors $Q_{122}$ and $Q_{123}$ should have a high gate width to gate length ratio. Thus, for example transistor $Q_{122}$ has a gate width of 10 microns and a gate length of 0.8 microns, and transistor $Q_{123}$ has a gate width of 6 microns and a gate length of 0.8 microns. When the voltage at node 57 falls below about $V_{CC}/2$ transistor $Q_{122}$ pulls node 58 high, and when the voltage at node 57 rises above about $V_{CC}/2$ transistor $Q_{125}$ pulls node 58 low. Thus, transistors $Q_{122}$ and $Q_{123}$ provide fast switching at node 58 for both low to high and high to low transitions through the asymmetrical delay line.

As shown in FIG. 2b, the open drain output of the HDC is comprised of N-channel transistor $Q_{126}$ and resistor 20. A rising voltage at node 58 switches on $Q_{126}$, which pulls down the voltage on signal line 60. Signal line 60 is coupled to pin 92. When transistor $Q_{126}$ switched on and pulls down signal line 60, capacitor 45 discharges, thereby reducing the VCO control. It is preferable that transistor $Q_{126}$ have a gate width of 50 microns and a gate length of 1 micron, which is large enough to discharge capacitor 45, but not so large as to draw excess current. Nevertheless, resistor 20 is provided to limit current flow through the open drain output in order to avoid noise generation.

The HDC detects and corrects VCO hyperactivity in the following manner. Sense line 61 monitors the VCO control. During normal PLL operation, the VCO control voltage should be below $V_{t1}$. However, should the VCO control voltage rise above $V_{t1}$, the dual threshold detector triggers a low to high voltage transition at node 52, thereby signalling a VCO reset. The VCO reset signal then slowly propagates through the asymmetrical delay line as discussed above. The VCO reset signal eventually reaches node 58 and switches on transistor $Q_{126}$ of the open drain output. Transistor $Q_{126}$ then pulls down the voltage on signal line 60, which reduces the VCO control by draining charge from capacitor 45. As capacitor 45 discharges, the voltage on sense line 61 falls. When the voltage on sense line 61 drops to $V_{t2}$, the dual threshold detector triggers a high to low voltage transition at node 52, thereby de-asserting the VCO reset. As discussed above, a high to low transition at node 52 is propagated through the asymmetrical delay line with little delay. As a result, the voltage at node 58 quickly drops and switches off transistor $Q_{126}$ which releases signal line 60. The PLL circuit can then proceed to lock onto reference signal 96.

The HDC incorporates means to de-assert the VCO reset signal should the PLL lock onto a reference signal 96 having a corresponding VCO control voltage greater than $V_{t1}$. Referring again to FIG. 2a, feedback sense 70 is coupled to the gate of N-channel transistor $Q_{107}$. A low to high voltage transition on feedback sense 70 indicates that feedback signal 98 is being received by the PFD. The gate of N-channel transistor $Q_{108}$ is coupled to node 59. As will be discussed below, node 59 is normally high causing transistor $Q_{108}$ to be normally switched on. A low to high transition on feedback sense 70 causes transistor $Q_{107}$ to switch on and pull down node 52, thereby de-asserting the VCO reset signal. As discussed above, a high to low transition an node 52 propagates with little delay through to node 58. Thus, even if the voltage on sense line 61 rises above $V_{t1}$, the HDC will not reset the VCO while the PFD is receiving a feedback signal 98.

The HDC also has means to prevent the feedback sense 70 from de-asserting the VCO reset signal while the open drain output is discharging capacitor 45. As shown in FIG. 2b, P-channel transistor $Q_{124}$ and N-channel transistor $Q_{125}$ are interconnected to form an inverter. The gates of transistors $Q_{124}$ and $Q_{125}$ are coupled to node 58, which is normally low causing transistor $Q_{124}$ to pull node 59 high. As discussed earlier, the VCO reset signal causes a low to high transition at node 58, which causes transistor $Q_{126}$ to discharge capacitor 45. However, a low to high transition at node 58 also switches on $Q_{125}$, which pulls node 59 low. When node 59 goes low, transistor $Q_{108}$ switches off and prevents transistor $Q_{107}$ from pulling down node 52 when a feedback sense 70 is detected. Thus, once the open drain output of the HDC has switched on, it will discharge capacitor 45 regardless of whether feedback signal 98 is being received by PFD 10.

Figure 5:
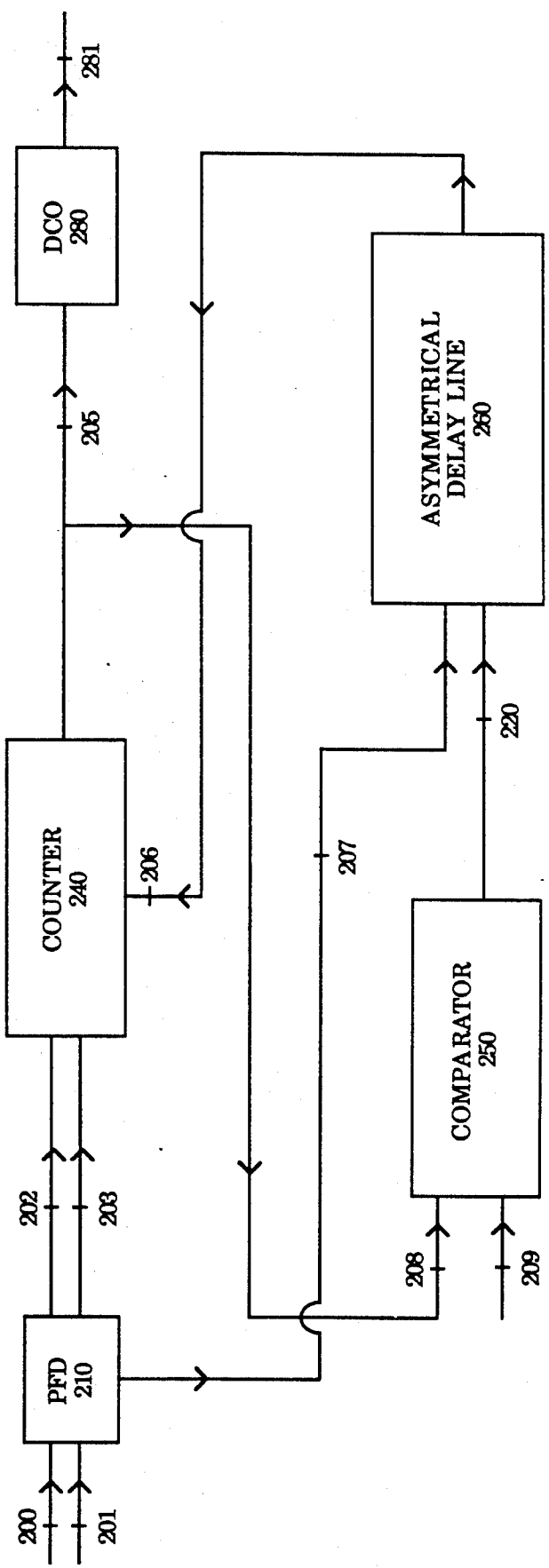
FIG. 5 shows an alternative embodiment of the present invention wherein an HDC is used to monitor a digitally controlled oscillator (DCO).

FIG. 5 illustrates an alternative embodiment of the PLL of the present invention that uses a digitally controlled oscillator (DCO). In this figure, the arrows on the signal lines indicate the direction of signal flow. PFD 210 receives a reference signal 200 and feedback signal 201, and generates pulses on signal lines 202 and 203 indicating the phase difference between reference signal 200 and feedback signal 201. Signal lines 202 and 203 drive counter 240 which is an up/down counter. The output of counter 240 is bus 205 which is a multi bit bus. Bus 205 provides the control for DCO 280, which generates a periodic signal 281 having a frequency proportional to the binary equivalent of the data contained on DCO control 205. For example, DCO 280 may be comprised of an digital to analog converter coupled to a VCO, wherein the digital data on DCO control 205 is converted to an analog voltage which drives a VCO.

In the alternative embodiment of FIG. 5, the HDC is comprised of comparator 250 and asymmetrical delay line 260. Input bus 208 of comparator 250 senses DCO control 205. Comparator 250 compares DCO control 205 with a predetermined limit received on input bus 209. Comparator 250 generates oscillator reset 220 which is coupled to asymmetrical delay line 260. Asymmetrical delay line 260 also receives feedback sense 207 which indicates whether PFD 210 is receiving feedback signal 201. In this embodiment, feedback sense 207 is coupled to the reset gate of PFD 210. Alternatively, an edge detector for feedback signal 201 could be used to provide feedback sense 207. Asymmetrical delay line 260 drives reset line 206 of counter 240. As in the previous embodiment, asymmetrical delay line 260 delays propagation of a low to high voltage transition.

The HDC in the embodiment of FIG. 5 detects and corrects DCO hyperactivity in the following manner. If feedback signal 201 is running slower than reference signal 200, signals 202 and 203 cause counter 240 to count up. On the other hand, if feedback signal 201 is running faster than reference signal 200, signals 202 and 203 cause counter 240 to count down. Comparator 250 detects whether the DCO control 205 exceeds predetermined limit 209, indicating that DCO control 205 is abnormally high. Comparator 250 generates a low to high transition of oscillator reset 220 which slowly propagates through asymmetrical delay line 260. Should feedback sense 207 indicate that feedback signal 201 is being received by PFD 210, asymmetrical delay line 260 quickly de-asserts the slowly propagating oscillator reset signal. The low to high transition of the oscillator reset signal propagates through to the output of asymmetrical delay line 260 to reset line 206 of counter 240. A low to high transition at reset line 206 causes counter 240 to reset to a predetermined reset state. The predetermined reset state of DCO control 205 is sensed by comparator 250, which in turn de-asserts oscillator reset 220. The PLL can then function normally to lock onto reference signal 200.

Figure 3:
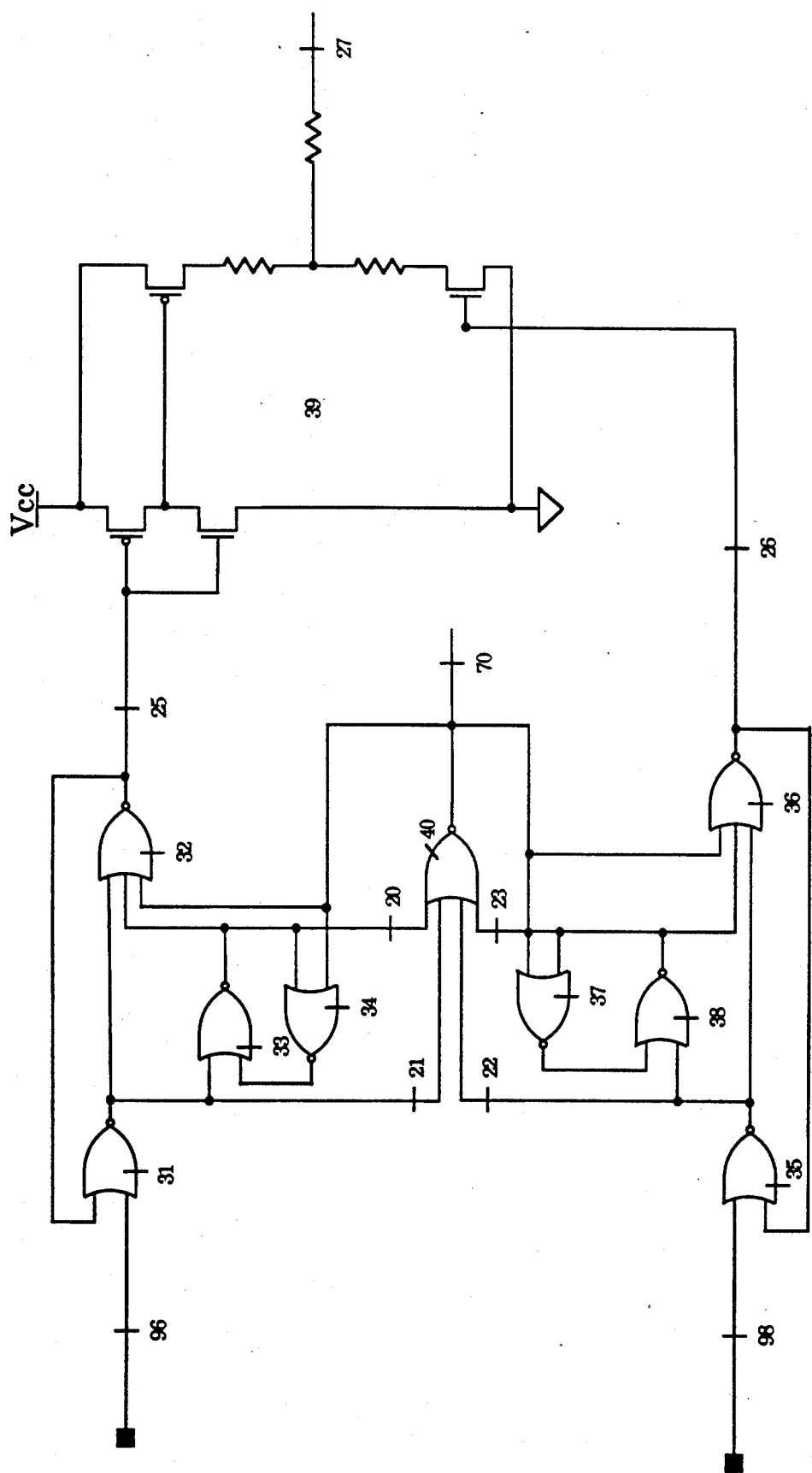
FIG. 3 shows a typical prior art PFD circuit comprised of NOR gates, including the lead portion, the lag portion, the NOR reset gate, and the charge pump circuit.

FIG. 3 depicts a typical prior art digital PFD. The inputs to the PFD are reference signal 96 and feedback signal 98. The PFD has a lead portion made up of logic gates 31 through 34 and a similarly configured lag portion made up of logic gates 35 through 38. Logic gates 31 through 38 are shown in this example to be NOR gates, however NAND gates may be used with equal effectiveness. The lead portion of the PFD generates a pulse at signal line 25 indicating that reference signal 96 is running faster than feedback signal 98. The lag portion of the PFD generates a pulse at signal line 26 indicating that reference signal 96 is running slower than feedback signal 98. Signal lines 25 and 26 are coupled to push-pull charge pump circuit 39, which is coupled to capacitor 45 through signal line 27. Charge pump 39 charges or discharges capacitor 45 depending upon the phase difference between reference signal 96 and feedback signal 98. The amount of charging or discharging is determined by the relative pulse widths of the signals on lines 25 and 26. If feedback signal 98 and reference signal 96 have the same frequency, the phase error signal 27 should remain constant.

Both the lead portion and lag portions of the PFD function as pairs of latches. In the lead portion, logic gates 31 and 32 function as a first latch and logic gates 33 and 34 function as a second latch. Similarly in the lag portion, logic gates 35 and 36 function as a third latch and logic gates 37 and 38 function as a fourth latch. In a typical prior art PFD, logic gate 40 is a four input NOR gate and is used to reset the four latches after the lead portion of the PFD has detected an edge of reference signal 96 and the lag portion has detected an edge of feedback signal 98. PFD reset 70 is coupled to all four of the PFD latches. When inputs 20 through 23 of logic gate 40 are all low, PFD reset 70 goes high and resets all four latches. However, there is no guarantee that the lead portion and the lag portion of the PFD will take the same amount of time to reset. If, for example, the lead portion should reset before the lag portion, inputs 20 and 21 will go high before inputs 22 and 23. Once input 20 or 21 goes high, PFD reset 70 will go low, thereby de-asserting reset before the lag portion has been properly reset. A new sample interval for the PFD begins when PFD reset 70 is de-asserted. Therefore, a PFD circuit that uses a standard logic gate for the PFD reset gate is vulnerable to a race condition that could cause the PFD to start sampling inputs before all parts of the PFD circuit have been reset.

Figure 4:
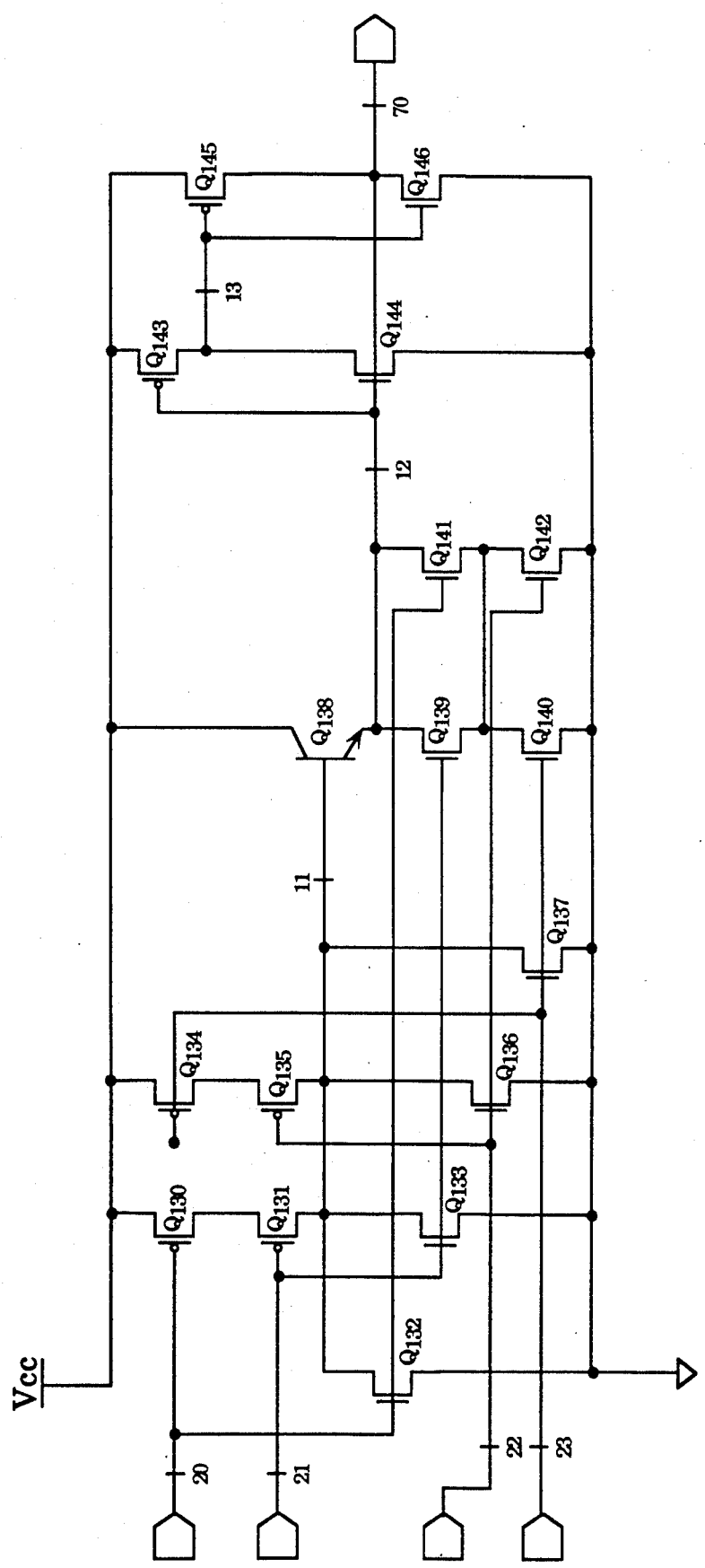
FIG. 4 illustrates the PFD reset gate of the present invention.

The PFD reset gate of the present invention performs the same logic function as a four input NOR gate while not being vulnerable to the race condition discussed above. The PFD reset gate of the present invention also provides a very fast switching reset signal in order to minimize the pulse widths of signals 25 and 26 which are input to charge pump 39, thereby minimizing input phase skew and unnecessary ripple on the VCO control. The PFD reset gate of the present embodiment is illustrated in FIG. 4. Input 20 is coupled to the gates of P-channel transistor $Q_{130}$ and N-channel transistor $Q_{132}$. Input 21 is coupled to the gates of P-channel transistor $Q_{131}$ and N-channel transistor $Q_{133}$. Input 22 is coupled to the gates of P-channel transistor $Q_{135}$ and N-channel transistor $Q_{136}$, and input 23 is coupled to the gates of P-channel transistor $Q_{134}$ and N-channel transistor $Q_{137}$. It is preferable that transistors $Q_{130}$ through $Q_{137}$ each have a gate width of 20 microns and a gate length of 0.8 microns.

A high voltage on any one of the inputs 20 through 23 causes node 11 to be pulled low. To illustrate, if input 20 is goes high, transistor $Q_{132}$ switches on and pulls down the voltage at node 11. Similarly, a high at input 21 pulls node 11 low through transistor $Q_{133}$, a high at input 22 pulls node 11 low through transistor $Q_{136}$, and a high at input 23 pulls node 11 low through transistor $Q_{137}$. When inputs 20 through 23 are all low, transistors $Q_{130}$, $Q_{131}$, $Q_{134}$, and $Q_{135}$ are all on and pull the voltage at node 11 high, thereby accomplishing a four input NOR logic function.

In the PFD reset gate of the present invention, the pull-up transistors are coupled in two paths, each path having two transistors in series. Transistors $Q_{130}$ and $Q_{131}$ are connected in series between node 11 and $V_{CC}$. Transistors $Q_{134}$ and $Q_{135}$ are connected in series between node 11 and $V_{CC}$ and parallel to transistors $Q_{130}$ and $Q_{131}$. Normally, inputs 20 through 23 will all go low at the same time to start a PFD reset. When inputs 20 through 23 all go low, transistors $Q_{130}$, $Q_{131}$, $Q_{134}$ and $Q_{135}$ all switch on, resulting in two transistor paths pulling up the voltage on node 11. Moreover, each path has two pull-up transistors in series. As a consequence, the signal at node 11 switches high four times as fast as a conventional NOR gate which typically has four pull-up transistors in series. Bipolar transistor $Q_{138}$ provides current gain to the fast switching signal at node 11 in order to drive PFD reset 70.

The PFD reset gate of the present invention will not de-assert PFD reset 70 until both lead and lag portions of the PFD have reset. In response to the PFD reset 70, inputs 20 and 21 go high to indicate that the lead portion of the PFD has reset, while inputs 22 and 23 goes high to indicate that the lag portion has reset. As discussed above, low to high voltage transition on any one of the inputs 20 through 23 causes the voltage at node 11 to be pulled down. However, even after node 11 is pulled down, the PFD reset 70 remains high until both lead and lag portions of the PFD circuit have responded to the reset. It will be appreciated that transistor $Q_{138}$ functions as a logical diode to prevent the voltage at node 12 from dropping and de-asserting the PFD reset 70 when node 11 is pulled low. PFD reset 70 can only be de-asserted by the combination of transistor $Q_{139}$ and either transistor $Q_{140}$ or transistor $Q_{142}$ pulling node 12 low, or by the combination of transistor $Q_{141}$ and either transistor $Q_{140}$ or transistor $Q_{142}$ pulling node 12 low. It is preferable that transistors $Q_{139}$ through $Q_{142}$ each have a gate width of 16 microns and a gate length of 0.8 microns. The gate of N-channel transistor $Q_{139}$ is coupled to input 21 and the gate of N-channel transistor $Q_{140}$ is coupled to input 23. The gate of N-channel transistor $Q_{141}$ is coupled to input 20 and the gate of N-channel transistor $Q_{142}$ is coupled to input 22. If input 21 goes high, transistor $Q_{139}$ switches on. Thereafter a high at input 22 or input 23, which indicates that the latches in both the lead and the lag portions of the PFD have reset, switches on transistor $Q_{140}$ or transistor $Q_{142}$, thereby causing node 12 to be pulled low and de-assert PFD reset 70. Similarly, if input 20 goes high causing transistor $Q_{141}$ to switch on, then a high at input 22 or input 23 switches on transistor $Q_{140}$ or transistor $Q_{142}$, thereby pulling node 12 low and de-asserting PFD reset 70.

Finally, transistors $Q_{143}$, $Q_{144}$, $Q_{145}$, and $Q_{146}$ and interconnected to form back to back inverters, and are used to ensure that PFD reset 70 is always driven. If one of the inputs 20 through 23 goes high after PFD reset 70 is asserted, node 11 goes low and PFD reset 70 is not driven. At that point, node 12 will still be high because of the diode effect of transistor $Q_{138}$. Node 12 is coupled to the gates of P-channel transistor $Q_{143}$ and N-channel transistor $Q_{144}$. A high voltage at node 12 switches on transistor $Q_{144}$ and switches off transistor $Q_{143}$, thereby pulling node 13 low. Node 13 is coupled to the gates of P-channel transistor $Q_{145}$ and N-channel transistor $Q_{146}$. A low voltage at node 13 switches on transistor $Q_{145}$ and switches off transistor $Q_{146}$. As a consequence, transistor $Q_{145}$ drives PFD reset 70 high until it is finally pulled low by transistors $Q_{139}$ and $Q_{140}$ or by transistors $Q_{141}$ and $Q_{142}$ as described above. It is preferable that transistor $Q_{145}$, be relatively small, and drives signal line 70 high relatively weakly compared to the capacity of transistors $Q_{139}$, $Q_{140}$, $Q_{141}$, and $Q_{142}$ to pull PFD reset 70 low. Toward that end, for example transistors $Q_{143}$, $Q_{144}$, and $Q_{145}$ each have a gate width of 3 microns and a gate length of 0.8 microns and transistor $Q_{146}$ has a gate width of 3 microns and a gate length of 2 microns.

The present invention has application for use in high speed digital computer environments and may be incorporated into a variety of digital and analog circuitry.

Although the present invention has been described in conjunction with the embodiments illustrated in FIGS. 1, 2, 4 and 5, it is evident that numerous alternatives, modifications, variations and uses will be apparent to those skilled in the art in light of the foregoing description.

What is claimed is:

1. A logic gate comprising:
   means for receiving a first signal;
   means for receiving a second signal;
   means for receiving a third signal;
   means for receiving a fourth signal;
   first switching means coupled between a voltage source and a first node, said first switching means passing electrical current between said voltage source and said first node when said first signal and said second signal are in a first state;
   second switching means coupled between said voltage source and said first node, said second switching means passing electrical current between said voltage source and said first node when said third signal and said fourth signal are in said first state;
   first transistor means coupled between said first node and a ground, said first transistor means having a control input coupled to said first signal, said first transistor means passing electrical current between said first node and said ground when said first signal is in a second state;
   second transistor means coupled between said first node and said ground, said second transistor means having a control input coupled to said second signal, said second transistor means passing electrical current between said first node and said ground when said second signal is in said second state;
   third transistor means coupled between said first node and said ground, said third transistor means having a control input coupled to said third signal, said third transistor means passing electrical current between said first node and said ground when said third signal is in said second state;
   fourth transistor means coupled between said first node and said ground, said fourth transistor means having a control input coupled to said fourth signal, said fourth transistor means passing electrical current between said first node and said ground when said fourth signal is in said second state;
   current amplifying means coupled between said voltage source and an output node, said current amplifying means coupled to said first node, said current amplifying means passing electrical current between said voltage source and said output node, said current amplifying means preventing electrical current from passing from said output node to said first node;
   third switching means coupled between said output node and said ground, said third switching means passing electrical current between said output node and said ground when said second signal and said fourth signal are in said second state; and
   fourth switching means coupled between said output node and said ground, said fourth switching means passing electrical current between said output node and said ground when said first signal and said third signal are in said second state;
   whereby said output node changes from said first state to said second state when said first and said second and said third and said fourth signals are all in said first state, said output node changes from said second state to said first state when said first signal and said third or said fourth signals are in said second state or when said second signal and said third or said fourth signals are in said second state.

2. The logic gate defined by claim 1, wherein said first switching means comprises fifth transistor means and sixth transistor means coupled in series between said voltage source and said first node, said fifth transistor means having a control input coupled to said first signal, said sixth transistor means having a control input coupled to said second signal, said fifth and said sixth transistor means passing electrical current between said voltage source and said first node when said first signal and said second signal are in said first state.

3. The logic gate defined by claim 2, wherein said second switching means comprises seventh transistor means and eighth transistor means coupled in series between said voltage source and said first node, said seventh transistor means having a control input coupled to said third signal, said eighth transistor means having a control input coupled to said fourth signal, said seventh and said eighth transistor means passing electrical current between said voltage source and said first node when said third signal and said fourth signal are in said first state.

4. The logic gate defined by claim 3, wherein said third switching means comprises:
   ninth transistor means coupled between said output node and a second node, said ninth transistor means having a control input coupled to said second signal, said ninth transistor means passing electrical current between said output node and said second node when said second signal is in said second state; and
   tenth transistor means coupled between said second node and said ground, said tenth transistor means having a control input coupled to said fourth signal, said tenth transistor means passing electrical current between said second node and said ground when said fourth signal is in said second state.

5. The logic gate defined by claim 4, wherein said fourth switching means comprises:
   eleventh transistor means coupled between said output node and said second node, said eleventh transistor means having a control input coupled to said first signal, said eleventh transistor means passing electrical current between said output node and said second node when said first signal is in said second state; and
   twelfth transistor means coupled between said second node and said ground, said twelfth transistor means having a control input coupled to said third signal, said twelfth transistor means passing electrical current between said second node and said ground when said third signal is in said second state.

6. The logic gate defined by claim 5, wherein said first transistor means and said second transistor means and said third transistor means and said fourth transistor means and said ninth transistor means and said tenth transistor means and said eleventh transistor means and said twelfth transistor means each comprise an N-channel transistor, and wherein said fifth transistor means and said sixth transistor means and said seventh transistor means and said eighth transistor means each comprise a P-channel transistor.

7. The logic gate defined by claim 5, wherein said current amplifying means comprises thirteenth transistor means coupled between said voltage source and said output node, said thirteenth transistor means having a control input coupled to said first node, said thirteenth transistor means passing electrical current between said voltage source and said output node when said first node is in said second state.

8. The logic gate defined by claim 7, wherein said thirteenth transistor means comprises an NMOS transistor.

9. The logic gate defined by claim 7, wherein said thirteenth transistor means comprises a bipolar NPN transistor having a base coupled to said first node, a collector coupled to said voltage source, and an emitter coupled to said output node.

10. The logic gate defined by claim 9, further comprising:
first inverter means coupled between said output node and a third node; and
second inverter means coupled between said third node and said output node.

11. The logic gate defined by claim 10, wherein said first inverter means comprises:
fourteenth transistor means coupled between said voltage source and said third node, said fourteenth transistor means having a control input coupled to said output node, said fourteenth transistor means passing electrical current between said voltage source and said third node when said output node is in said first state; and
fifteenth transistor means coupled between said third node and said ground, said fifteenth transistor means having a control input coupled to said output node, said fifteenth transistor means passing electrical current between said third node and said ground when said output node is in said second state.

12. The logic gate defined by claim 11, wherein said second inverter means comprises:
sixteenth transistor means coupled between said voltage source and said output node, said sixteenth transistor means having a control input coupled to said third node, said sixteenth transistor means passing electrical current between said voltage source and said output node when said third node is in said first state; and
seventeenth transistor means coupled between said output node and said ground, said seventeenth transistor means having a control input coupled to said third node, said seventeenth transistor means passing electrical current between said output node and said ground when said third node is in said second state.

13. The logic gate defined by claim 12, wherein said fourteenth transistor means and said fifteenth transistor means and said sixteenth transistor and said seventeenth transistor means are each sized to pass less electrical current than each of said ninth transistor means and said tenth transistor means and said eleventh transistor means and said twelfth transistor means.

14. The logic gate defined by claim 13, wherein said fourteenth transistor means and said sixteenth transistor means each comprise a P-channel transistor, and wherein said fifteenth transistor means and said seventeenth transistor means each comprise an N-channel transistor.

15. A logic gate comprising:
means for receiving a first signal;
means for receiving a second signal;
means for receiving a third signal;
means for receiving a fourth signal;
first transistor means coupled between a first node and a ground, said first transistor means having a control input coupled to said first signal, said first transistor means passing electrical current between said first node and said ground when said first signal is in a second state;
second transistor means coupled between said first node and said ground, said second transistor means having a control input coupled to said second signal, said second transistor means passing electrical current between said first node and said ground when said second signal is in said second state;
third transistor means coupled between said first node and said ground, said third transistor means having a control input coupled to said third signal, said third transistor means passing electrical current between said first node and said ground when said third signal is in said second state;
fourth transistor means coupled between said first node and said ground, said fourth transistor means having a control input coupled to said fourth signal, said fourth transistor means passing electrical current between said first node and said ground when said fourth signal is in said second state;
fifth transistor means and sixth transistor means coupled in series between a voltage source and said first node, said fifth transistor means having a control input coupled to said first signal, said sixth transistor means having a control input coupled to said second signal, said fifth and said sixth transistor means passing electrical current between said voltage source and said first node when both said first signal and said second signal are in a first state;
seventh transistor means and eighth transistor means coupled in series between said voltage source and said first node, said seventh transistor means having a control input coupled to said third signal, said eighth transistor means having a control input coupled to said fourth signal, said seventh and said eighth transistor means passing electrical current between said voltage source and said first node when said third signal and said fourth signal are in said first state;
ninth transistor means coupled between an output node and a second node, said ninth transistor means having a control input coupled to said second signal, said ninth transistor means passing electrical current between said output node and said second node when said second signal is in said second state;
tenth transistor means coupled between said second node and said ground, said tenth transistor means having a control input coupled to said fourth signal, said tenth transistor means passing electrical current between said second node and said ground when said fourth signal is in said second state;
eleventh transistor means coupled between said output node and said second node, said eleventh transistor means having a control input coupled to said first signal, said eleventh transistor means passing electrical current between said output node and said second node when said first signal is in said second state;
twelfth transistor means coupled between said second node and said ground, said twelfth transistor means having a control input coupled to said third signal, said twelfth transistor means passing electrical current between said second node and said ground when said third signal is in said second state; and thirteenth transistor means coupled between said voltage source and said output node, said thirteenth transistor means having a control input coupled to said first node, said thirteenth transistor means passing electrical current between said voltage source and said output node when said first node is in said second state;

whereby said output node changes from said first state to said second state when said first and said second and said third and said fourth signals are all in said first state, said output node changes from said second state to said first state when said first signal and said third or said fourth signals are in said second state or when said second signal and said third or said fourth signals are in said second state.

16. A method for resetting a digital phase and frequency detector of a phase-locked loop circuit, said digital phase and frequency detector having a first latch, a second latch, a third latch, and a fourth latch, comprising the steps of:

receiving a first signal from an output of said first latch;

switching on electrical current flow between a first node and a ground when said first signal is in a second state;

receiving a second signal from an output of said second latch;

switching on electrical current flow between said first node and said ground when said second signal is in said second state;

receiving a third signal from an output of said third latch;

switching on electrical current flow between said first node and said ground when said third signal is in said second state;

receiving a fourth signal from an output of said fourth latch;

switching on electrical current flow between said first node and said ground when said fourth signal is in said second state;

amplifying electrical current flow from said first node to an output node;

preventing electrical current flow from said output node to said first node;

switching on electrical current flow between said voltage source and said first node when said first signal and said second signal are both in a first state;

switching on electrical current flow between said voltage source and said first node when said third signal and said fourth signal are both in said first state;

switching on electrical current flow between said output node and said ground when said second signal and said third or said fourth signals are in said second state; and switching on electrical current flow between said output node and said ground when said first signal and said third or said fourth signals are in said second state;

whereby said output node provides a reset signal for said first latch and said second latch and said third latch and said fourth latch.

* * * * *